(12) United States Patent
Tsuchida

(10) Patent No.: US 12,408,545 B2
(45) Date of Patent: Sep. 2, 2025

(54) DISPLAY DEVICE

(71) Applicant: Sharp Display Technology Corporation, Kameyama (JP)

(72) Inventor: Kenichiroh Tsuchida, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 154 days.

(21) Appl. No.: 18/286,761

(22) PCT Filed: May 14, 2021

(86) PCT No.: PCT/JP2021/018499
§ 371 (c)(1),
(2) Date: Oct. 13, 2023

(87) PCT Pub. No.: WO2022/239251
PCT Pub. Date: Nov. 17, 2022

(65) Prior Publication Data
US 2024/0196722 A1  Jun. 13, 2024

(51) Int. Cl.
*G06F 1/16* (2006.01)
*H10K 77/10* (2023.01)
*H10K 102/00* (2023.01)

(52) U.S. Cl.
CPC .......... *H10K 77/111* (2023.02); *G06F 1/1681* (2013.01); *H10K 2102/311* (2023.02)

(58) Field of Classification Search
CPC .... G06F 1/1652; G06F 1/1616; G06F 1/1641; G09F 9/301
See application file for complete search history.

(56) References Cited

U.S. PATENT DOCUMENTS

2017/0200915 A1\* 7/2017 Lee ........................... B32B 7/12
2020/0371553 A1\* 11/2020 Hsu ........................ G06F 1/1624
2021/0210690 A1\* 7/2021 Park .................... H10K 85/1135

FOREIGN PATENT DOCUMENTS

JP  2017-126061 A  7/2017

\* cited by examiner

*Primary Examiner* — Allen L Parker
*Assistant Examiner* — Dakota M Talbert
(74) *Attorney, Agent, or Firm* — ScienBiziP, P.C.

(57) ABSTRACT

A display device includes: a casing; and an OLED module. The casing includes a coupling portion coupling together, on a coupling surface, a bending region and an end region. When a display surface of the OLED module is folded into a valley shape in a first direction, the coupling portion pulls an end region of the casing in a second direction for folding the display surface into a mountain shape. The second direction is opposite to the first direction.

12 Claims, 13 Drawing Sheets

DISPLAY DEVICE

TECHNICAL FIELD

The disclosure relates to a display device.

BACKGROUND ART

Recent years have seen development of flexible display devices. Unlike tablet display devices, the flexible display devices can change their shapes in various manners. Since users can easily carry around the flexible display devices, the flexible display devices can increase user convenience. Examples of the flexible display devices include: bendable display devices that can be bent; foldable display devices that can be folded; and rollable display devices that can be rolled.

For example, Patent Document 1 discloses a foldable display device including a plurality of layers bonded together to form an OLED module. To bond the layers together, a storage elastic modulus of the adhesive is defined.

CITATION LIST

Patent Literature

[Patent Document 1] Japanese Unexamined Patent Application Publication No. 2017-126061

SUMMARY

Technical Problems

Here, usually, the OLED module of the above-described flexible display device is formed of layers bonded together with an adhesive. In this case, when the display device including the OLED module is bent, the layers of the OLED module slip, expand, and contract, causing difference in variation (displacement) between the layers because of the thickness of the OLED module. As a result, each of the layers undergoes internal stresses such as tensile stress and compressive stress. In particular, each of the layers in an end region of the OLED module undergoes delamination stress.

When the OLED module is repeatedly bent, plastic deformation is observed of the adhesive bonding together the layers of the OLED module, and the adhesion strength of the adhesive decreases. As a result, the slip of the OLED module gradually progresses. During the slip, each of the layers of the OLED module continuously undergoes compressive stress or tensile stress, thereby causing variations in dimension of each layer. If the layers attached together have different dimensions, delamination stress occurs.

When the adhesive bonding the layers of the OLED module cannot relief any more the delamination stress generated by the difference in expansion and contraction between the layers, an interface of the adhesive might develop cracks and cause delamination. Furthermore, if the layers are firmly bonded together with the adhesive, the layers of the OLED module might be delaminated from each other, and a crack might open in the panel. As a result, quality appearance of the display device could be spoiled.

Patent Document 1 also mentions displacement between the layers observed when the display device folded in a closed state is opened, and the resulting tilt caused to a cross-section of an end region of each of the layers. However, the display device disclosed in Patent Document 1 neither corrects the displacement of each of the layers caused when the layers slip, expand, and contract, nor reduces internal stress generated in each of the layers when the display device is bent.

Hence, an aspect of the disclosure sets out to provide a display device capable of reducing internal stress generated in each of the layers of an OLED module when the display device is bent.

Solution to Problems

A display device according to an aspect of the disclosure includes: a casing; and an OLED module supported by the casing and including a plurality of layers including an OLED layer, the plurality of layers being stacked on top of another through an adhesive. The casing includes a coupling portion coupling together, on a coupling surface provided across from a support surface supporting the OLED module, a bending region of the casing and at least one end region of the casing. The coupling portion includes one or more coupling portions. The coupling surface and the support surface are included in a surface of the casing. The bending region includes one or more bending regions for folding a display surface of the OLED module into a valley shape. When the display surface is folded into a valley shape in a first direction, the coupling portion pulls the at least one end region of the casing in a second direction for folding the display surface into a mountain shape. The second direction is opposite to the first direction.

Advantageous Effect

An aspect of the disclosure can provide a display device capable of reducing internal stress generated in each of the layers of an OLED module when the display device is bent.

DESCRIPTION OF EMBODIMENTS

First Embodiment

With reference to drawings, a display device 1 according to a first embodiment of the disclosure will be described.

Figure 1:
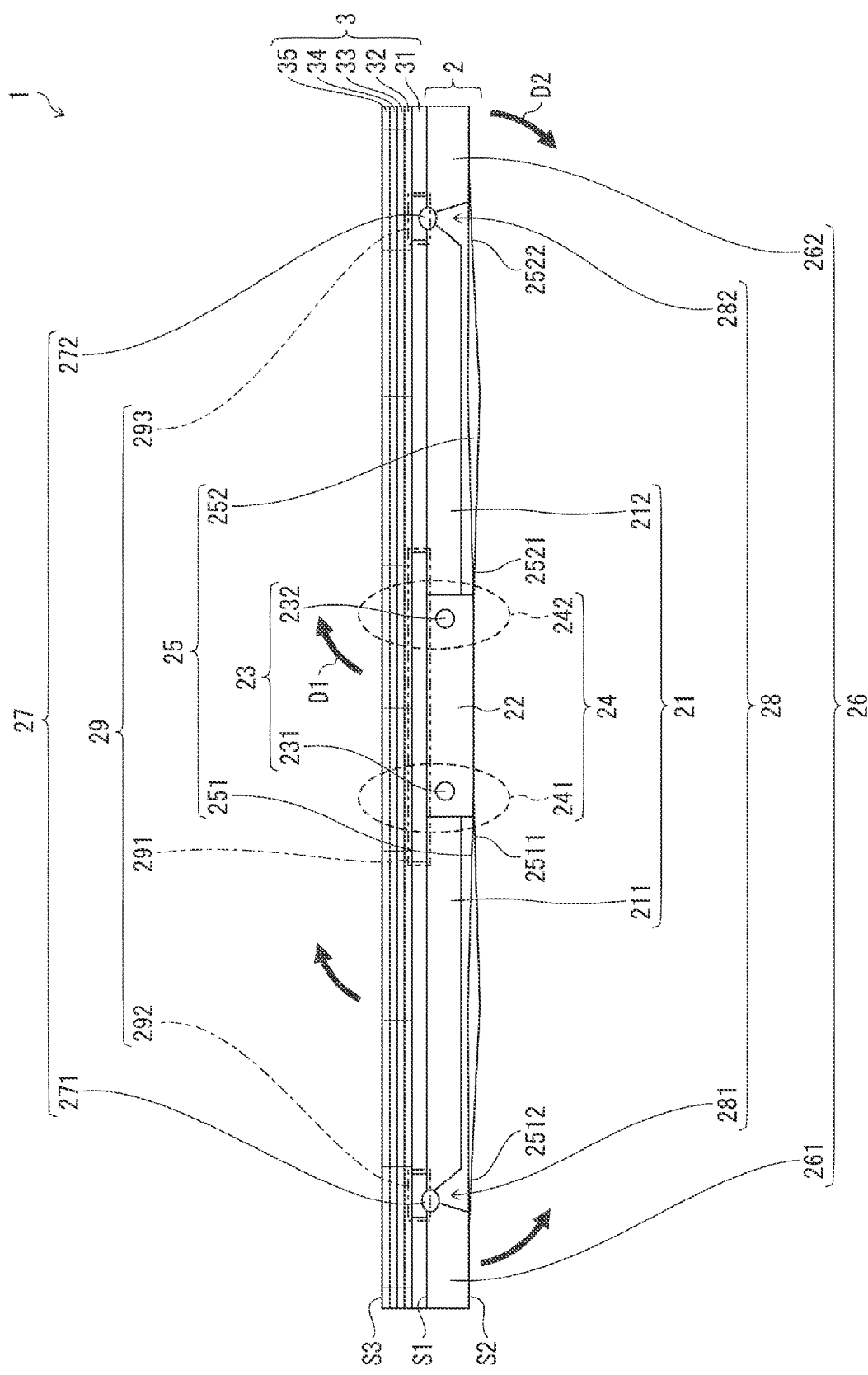
FIG. 1 is a side view illustrating an example of a display device in an open state according to a first embodiment.

FIG. 1 is a side view (a cross-sectional side view) illustrating an example of the display device 1 in an open state according to the first embodiment.

Display Device 1

The display device 1 is a flexible display device capable of changing its shape in various manners.

Examples of the display device 1 include an organic electroluminescence (EL) display including organic light-emitting diodes (OLEDs) as electro-optical elements whose brightness and transmittance are controlled by electric currents. The display device 1 can be used as, for example, a portable terminal such as a smartphone and a tablet terminal.

The display device 1 is in any given size. Suitably, the display device 1 according to the disclosure may be, for example, 140 mm or more and 160 mm or less in length, 60 mm or more and 80 mm or less in width, and 5 mm or more and 20 mm or less in thickness.

As illustrated in FIG. 1, the display device 1 includes: a casing 2; and an OLED module 3 supported by the casing 2. Furthermore, the casing 2 and the OLED module 3 in the open state are open flat.

Casing 2

As illustrated in FIG. 1, the casing 2 includes: a display unit 21; a support portion 22; a first connecting portion 23; a coupling portion 25; a bending portion 26; and a second connecting portion 27. Furthermore, the casing 2 includes: a bending region 24; a notch portion 28; and an unfastened region 29.

As illustrated in FIG. 1, when the display device 1 is in the open state, the display unit 21, the support portion 22, the first connecting portion 23, the coupling portion 25, the bending portion 26, and the second connecting portion 27 in the casing 2 are open flat.

Display Unit 21

The display unit 21 is a screen to display, for example, images and characters.

In the example illustrated in FIG. 1, the display unit 21 includes: a display unit 211 and a display unit 212. However, in this embodiment, the display unit 21 may include one or more display units. Alternatively, the display unit 21 may include either one display unit, or three or more display units.

Note that, as illustrated in FIG. 1, the display unit 21 includes the two display units 211 and 212, so that the display unit 21 is not bent within regions of the two display units 211 and 212. Hence, the casing 2 can be bent more ideally.

Support Portion 22

The support portion 22 supports the display unit 21.

As illustrated in FIG. 1, when the casing 2 includes the support portion 22, the support portion 22 may be provided in a region for bending the casing 2 (e.g., a center region of the casing 2). The support portion 22 is provided in a region for bending the casing 2, such as the center region of the casing 2. Hence, the casing 2 can be bent more ideally.

Furthermore, as illustrated in FIG. 1, when the support portion 22 is provided in a region for bending the casing 2, the support portion 22 may include the first connecting portion 23 in the bending region 24 that is the region for bending the casing 2. Because the support portion 22 includes the first connecting portion 23, the casing 2 can be bent more ideally.

The support portion 22 has any given thickness. For example, the thickness is 1 mm or more and 2 mm or less. Because the thickness of the support portion 22 is 1 mm or more and 2 mm or less, the display device 1 can be folded more ideally.

First Connecting Portion 23

The first connecting portion 23 rotatably connects together, upon the first connecting portion 23, one end region of the display unit 21 and one end region of the support portion 22.

In the example illustrated in FIG. 1, the first connecting portion 23 includes: a first connecting portion 231 connecting together one end region of the display unit 211 and the one end region of the support portion 22; and a first connecting portion 232 connecting together one end region of the display unit 212 and an other end region of the support portion 22. In other words, in the example illustrated in FIG. 1, the display units 211 and 212 are connected to the support portion 22 through the first connecting portions 231 and 232.

Note that, if, in this embodiment, the display unit 21 is one display unit, one first connecting portion 23 may connect together one end region of the one display unit 21 and one end region of the support portion 22, so that the end regions are rotatable upon the first connecting portion 23. Hence, if the casing 2 includes at least one first connecting portion 23, the casing 2 can be bent more easily and ideally.

Examples of the first connecting portion 23 include a hinge. When the first connecting portion 23 is a hinge, the casing 2 can be bent more easily and ideally.

Bending Region 24

The bending region 24 is a region for bending the casing 2. The bending region 24 is provided for folding, into a concave valley shape, a support surface S1 included in a surface of the casing 2 and a display surface S3 of the OLED module 3. The support surface S1 supports the OLED module 3.

Figure 2:
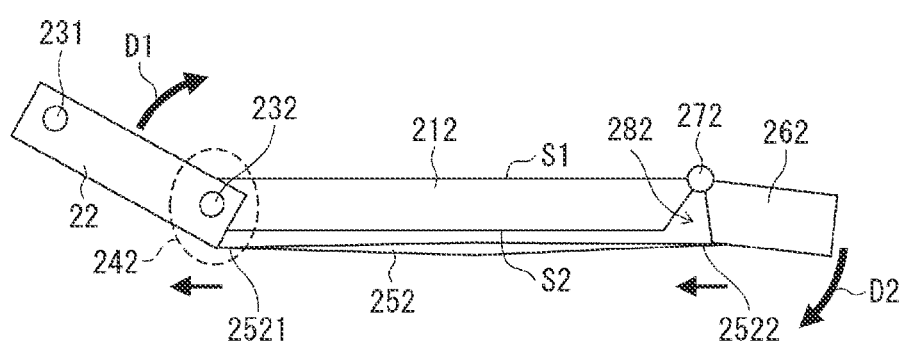
FIG. 2 is a side view illustrating an example of a closing operation of a casing in the display device according to the first embodiment.
Figure 3:
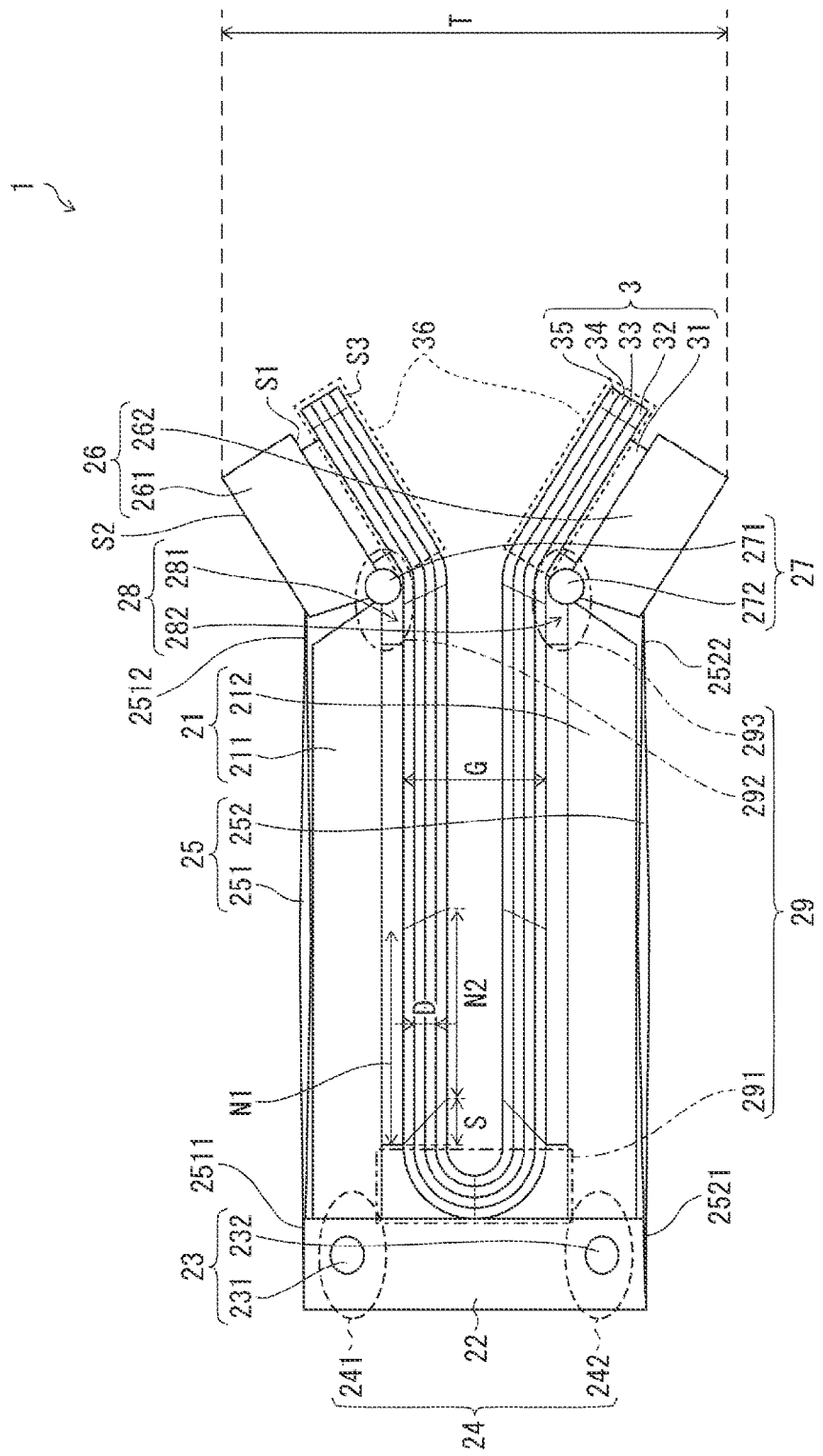
FIG. 3 is a side view illustrating an example of the display device in a closed state according to the first embodiment.

With reference to FIGS. 1 to 3, the bending region 24 will be described in detail below.

FIG. 2 is a side view illustrating an example of a closing operation of the casing 2 in the display device 1 according to the first embodiment. In other words, FIG. 2 illustrates an example of the casing 2 when the casing 2 begins to close. FIG. 3 is a side view illustrating an example of the display device 1 in a closed state according to the first embodiment. In other words, FIG. 3 illustrates an example of the display device 1 when the casing 2 is completely closed.

As illustrated in FIG. 3, in the closed state, the OLED module 3 is folded toward concavity in the unfastened region 291; that is, a center region of the support portion 22 and the OLED module 3 and the bending region. The bending portion 26; that is, an end region of the casing 2, is open toward convexity.

In the examples illustrated in FIGS. 1 to 3, the bending region 24 is the end region of the support portion 22. Furthermore, when the display unit 211 rotates upon the first connecting portion 231 and the display unit 212 rotates upon the first connecting portion 232, a bending region 241 and a bending region 242 act as regions for folding the display surface S3 of the casing 2 into a valley shape.

In this embodiment, one or more bending regions 24 may be provided. The bending regions 24 may be provided in any given number. As illustrated in FIGS. 1 to 3, two bending regions 24 are preferably provided. When two bending regions 24 are provided, the display device 1 can be bent more ideally, and as illustrated in FIG. 3, the display device 1 can be easily folded. Hence, the display device 1 can be used suitably as a foldable display device.

Note that, in the example illustrated in FIG. 3, the unfastened region 291, in which the display surface S3 of the OLED module 3 is folded into a valley shape, is the center region of the support portion 22. The unfastened region 291 is positioned differently relative to the bending region 24 for bending the casing 2. Note that, in this embodiment, the casing 2 does not have to include the support portion 22, and may include a bendable display unit alone. The unfastened region 291 and the bending region 24 may be a common region. Even in such a case, the display device 1 according to this embodiment can reduce internal stress generated in each of the layers in the OLED module 3.

Coupling Portion 25

The coupling portion 25 couples together, on a coupling surface S2 across from the support surface S1, the bending region 24 and the bending portion 26 that is at least one end region of the casing 2. In the example illustrated in FIG. 1, a coupling portion 251 couples together the bending portion 261 and the bending region 241 that is one end region of the support portion 22. A coupling portion 252 couples the bending portion 262 and the bending region 242 that is an other end region of the support portion 22.

As illustrated in FIG. 1, the coupling portion 25 may couple together at least one end region of the support portion 22 and the bending portion 26 that is at least one end region of the casing 2. Thanks to such a feature, the first connecting portion 23, the bending portion 26, and the second connecting portion 27 coordinate to synchronously bend, in the same manner as the coupling portion 25 couples together the bending region 24 and the bending portion 26 on the coupling surface S2 across from the support surface S1.

Furthermore, when the display surface S3 is folded into a valley shape in a first direction, the coupling portion 25 pulls the bending portion 26 in a second direction for folding the display surface S3 into a mountain shape. The second direction is opposite to the first direction.

In the example illustrated in FIG. 2, when the support portion 22 rotates, upon the second connecting portion 272, toward the concavity in a first direction D1 with respect to the display unit 212, and the display surface S3 is folded into a valley shape, the coupling portion 252 cooperates with the support portion 22 to be pulled in a left direction as indicated by arrows in FIG. 2.

Hence, when the support portion 22 rotates, upon the second connecting portion 272, toward the concavity in the first direction D1 with respect to the display unit 212, and the display surface S3 is folded into a valley shape, the coupling portion 252 pulls the bending portion 262 toward the convexity in a second direction D2, which is opposite to the first direction D1, for folding the display surface S3 into a mountain shape. Likewise, when the display surface S3 is folded into a valley shape, the coupling portion 251 pulls the bending portion 261 toward the convexity opposite in direction to the concavity toward which the display device 1 is closed.

Hence, when the coupling portion 25 pulls the bending portion 26, the coupling portion also pulls an end region 36 included in the OLED module and supported by the bending portion 26. Thus, as illustrated in FIG. 3, when the display surface S3 is folded into a valley shape, and the display device 1 is bent and folded, the end region 36 of the OLED module is also pulled.

Then, the end region 36 develops an interlayer slip in a direction opposite to an interlayer slip of the OLED module 3 in the unfastened region 291 that is the bending region of the OLED module 3, thereby making it possible to reduce difference in dimensional variation between the layers in the OLED module 3. As a result, the internal stress of each of the layers in the OLED module 3 can be canceled out and reduced, which successfully reduces delamination of the layers.

Furthermore, in the example illustrated in FIG. 3, when the coupling portion 25 pulls the bending portion 26, the bending portion 26 is bent toward the convexity opposite in direction to the concavity toward which the display device 1 is closed. Accordingly, the OLED module 3 supported by the bending portion 26 also warps toward the convexity, which is opposite in direction in which the display device 1 is closed. Such a feature can further reduce the internal stress generated in each of the layers in the OLED module 3.

When the end region 36 of the OLED module is pulled, the internal stress generated in each of the layers in the OLED module 3 can be reduced. The reason will be described in more detail below in comparison with a display device 1' and a display device 1" according to known techniques.

As seen in the example illustrated in FIG. 1, the coupling portion 25 may be provided below the first connecting portion 23 and the second connecting portion 27. Hence, when the first connecting portion 23 is bent toward the concavity, the second connecting portion 27 is easily bent toward the concavity. Such a feature can further reduce the internal stress generated in each of the layers in the OLED module 3.

Figure 4:
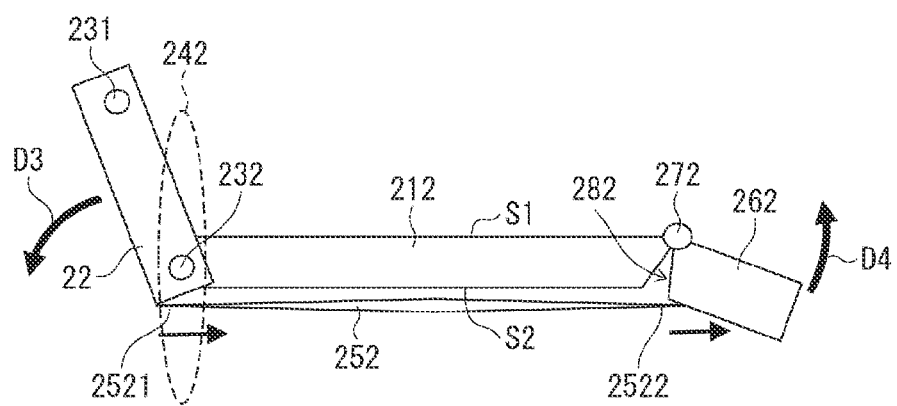
FIG. 4 is a side view illustrating an example of an opening operation of the casing in the display device according to the first embodiment.

With reference to FIG. 4, described below will be an operation of the coupling portion in an operation to open the display device 1. FIG. 4 is a side view illustrating an example of an opening operation of the casing 2 in the display device 1 according to the first embodiment. In other words, FIG. 4 illustrates an example of the casing 2 when the casing 2 begins to open.

In the example illustrated in FIG. 4, when the support portion 22 rotates, upon the first connecting portion 232, in a third direction D3 in which the casing 2 of the display device 1 opens (i.e., returning to an initial state) with respect to the display unit 212, the coupling portion 252 cooperates with the support portion 22 to be pushed out in the right direction indicated by arrows in FIG. 4. Thus, when the support portion 22 rotates in the third direction D3 upon the first connecting portion 232, the coupling portion 252 pushes out the bending portion 262 in a fourth direction opposite to the third direction D3. The bending portion 262 also returns to the initial state. Likewise, when the display unit 211 rotates in a direction in which the display device 1 opens with respect to the support portion 22, the coupling portion 251 pushes out the bending portion 261 in the direction opposite to the direction in which the display device 1 opens. Thus, the bending portion 261 also returns to the initial state.

In the examples illustrated in FIGS. 1 to 4, an end region 2511 and an end region 2512 of the coupling portion 251, and an end region 2521 and an end region 2522 of the coupling portion 252, are inclined inwards and tapered. As described above, at least one end region of the coupling portion 25 may be inclined inwards and tapered. Because at least one end region of the coupling portion 25 is inclined inwards and tapered, the bending portion 26 is less likely to make contact with, and interfere with, the coupling surface S2 of the casing 2 even if the bending portion 26 bends toward the convexity. Thus, the bending portion 26 can be bent more ideally.

Examples of the coupling portion 25 include a thin plate member and a bar member. The thin plate member is, for example, a thin metal plate such as a SUS plate. The bar member is, for example, a shaft. Because the coupling portion 25 is either a SUS plate or a shaft, the coupling portion 25 can couple together the bending region 24 and the bending portion 26 more ideally, and pull the bending portion in a direction opposite to the valley folding direction.

The coupling portion 25 has any given thickness. The thickness is, for example, 140 µm or more and 160 µm or less. Because the coupling portion 25 has a thickness of 140 µm or more and 160 µm or less, the bending portion 26; that is, an end region of the casing 2, can be bent more ideally.

Bending Portion 26

The bending portion 26 is an end region of the casing 2. As illustrated in FIG. 1, when the casing 2 is in the open state, the bending portion 26 is open flat.

When the display surface S3 is folded into a valley shape, the bending portion 26 is pulled by the coupling portion 25 in the second direction toward the convexity at which the display surface S3 is folded into a mountain shape. The second direction is opposite to the first direction toward the concavity at which the display surface S3 folded into a valley shape. Hence, when the coupling portion 25 pulls the bending portion 26, the coupling portion 25 also pulls the end region 36 included in the OLED module supported by the bending portion 261.

Thus, the end region 36 develops an interlayer slip in a direction opposite to an interlayer slip of the OLED module 3 in the unfastened region 291 that is the bending region of the OLED module 3, thereby making it possible to reduce difference in dimensional variation between the layers in the OLED module 3. As a result, the internal stress of each of the layers in the OLED module 3 can be canceled out and reduced, which successfully reduces delamination of the layers.

Furthermore, when the bending portion 26 is pulled in the second direction toward the convexity at which the display surface S3 is folded in a mountain shape, the bending portion 26 may be bent in the second direction toward the convexity. Hence, as the bending portion 26 is bent toward the convexity opposite in direction to the concavity toward which the display device 1 is closed, the OLED module 3 supported by the bending portion 26 also warps toward the convexity opposite in direction to the concavity toward which the display device 1 is closed. Such a feature can further reduce the internal stress generated in each of the layers in the OLED module 3.

Moreover, when the display surface S3 is folded into a valley shape, the bending portion 26 may rotate in the second direction upon the second connecting portion 272. Thus, the bending portion 26 can be bent more easily and ideally. As a result, the bending portion 2, and the OLED module 3 supported by the bending portion 26 can warp more easily and ideally. Such a feature can further reduce more ideally the internal stress generated in each of the layers of the OLED module 3.

In the example illustrated in FIG. 2, when the support portion 22 rotates, upon the second connecting portion 272, toward the concavity in the first direction D1 with respect to the display unit 212, and the display surface S3 is folded into a valley shape, the coupling portion 252 is pulled by the support portion 22. Furthermore, when the coupling portion 252 is pulled by the support portion 22, the bending portion 262 is pulled in the second direction D2 toward the convexity, which is opposite in direction to the first direction D1. Likewise, when the display surface S3 is folded into a valley shape, the coupling portion 251 is pulled by the support portion 22. Accordingly, the bending portion 261 is pulled toward the convexity, which is opposite in direction in which the display device 1 is closed.

Furthermore, in the example illustrated in FIG. 3, when the coupling portion 25 pulls the bending portion 26, the bending portion 26 is bent toward the convexity opposite in direction to the concavity toward which the display device 1 is closed.

In FIG. 4, when the support portion 22 rotates upon the second connecting portion 232 in the third direction D3, with respect to the display unit 212, toward the convexity toward which the display device 1 is open, the bending portion 262 is pulled by the coupling portion 252 toward the concavity in the fourth direction D4 opposite to the third direction D3. Likewise, when the display unit 211 rotates in a direction in which the display device 1 opens with respect to the support portion 22, the bending portion 261 is pulled by the coupling portion 251 toward the concavity, which is opposite in direction in which the display unit 1 opens.

In the examples illustrated in FIGS. 1 to 4, the bending portion 26 includes two bending portions of the bending portion 261 and the bending portion 262. Alternatively, in this embodiment, the bending portion 26 may include one bending portion alone. Note that, as seen in the examples illustrated in FIGS. 1 to 4, the bending portion 26 includes preferably two bending portions including the bending portion 261 and the bending portion 262. When the bending portion 26 includes two bending portions, the internal stress generated in each of the layers of the OLED module 3 can be further reduced when the display device 1 is bent.

Second Connecting Portion 27

The second connecting portion 27 connects together an other end region of the display unit 21 and one end region of the bending portion 26, and rotates upon the second connecting portion 27. The other end region of the display unit 21 is not connected to the support portion 22. As illustrated in FIG. 1, when the casing 2 is in the open state, the second connecting portion 27 is open flat.

In the example illustrated in FIG. 1, a second connecting portion 271 and a second connecting portion 272 are respectively positioned in one end region and an other end region of the casing 2. The second connecting portion 271 and the second connecting portion 272 are fastened to the casing 2 and bend, so that the bending portion 261 included in the one end region of the casing 2 and the bending portion 262 included in the other end region of the casing 2 bend. Furthermore, the second connecting portions 271 and 272 cooperate with the first connecting portions 231 and 232 to bend in directions opposite to the first connecting portions 231 and 232.

In the example illustrated in FIG. 1, the second connecting portion 271 connects together an other end region of the display unit 211 and one end region of the bending portion 261, and rotates upon the second connecting portion 271. The other end region of the display unit 211 is not connected to the support portion 22. Furthermore, the second connecting portion 272 connects together an other end region of the display unit 212 and one end region of the bending portion 262, and rotates upon the second connecting portion 272. The other end region of the display unit 212 is not connected to the support portion 22.

In other words, the display unit 211 and the bending portion 261 are connected together through the second connecting portion 271. Furthermore, the display unit 212 and the bending portion 262 are connected together through the second connecting portion 272.

As can be seen, other than the bending region 24 of the casing 2, the second connecting portion 27 is provided. The second connecting portion 27 rotatably connects together an other end region of the display unit 21 and one end region of the bending portion 26, upon the second connecting portion 27. Such features allow the bending portion 26 to be bent more easily and ideally. As a result, the OLED module 3 supported by the bending portion 26 can also be bent more easily and ideally. Such a feature can reduce more ideally the internal stress generated in each of the layers of the OLED module 3.

The second connecting portion 27 is provided to the support surface S1 including: the other end region, of the display unit 21, not connected to the support portion 22; and the one end region of the bending portion 26. In this case, the notch portion 28 may be provided to a region, of the coupling surface S2, across from the second connecting portion 27.

In the example illustrated in FIG. 1, the second connecting portion 271 is provided to the support surface S1 including: the other end region included in the end region of the display unit 211 and not connected to the support portion 22; and the one end region of the bending portion 261. The second connecting portion 272 is provided to the support surface S1 including: the other end region included in the end region of the display unit 212 and not connected to the support portion 22; and the one end region of the bending portion 262. Furthermore, the coupling surface S2 includes a region across from the second connecting portion 271, and the region includes a notch portion 281. The coupling surface S2 includes a region across from the second connecting portion 272, and the region includes a notch portion 282.

As can be seen, the second connecting portion 27 is provided to the support surface S1 including: the other end region of the display unit 21; and the one end region of the bending portion 26. The notch portion 28 is provided in a region across from the second connecting portion 27. Hence, the bending portion 26 can be bent more easily and ideally. As a result, the OLED module 3 supported by the bending portion 26 can also be bent more easily and ideally. Such a feature can reduce more ideally the internal stress generated in each of the layers of the OLED module 3.

Examples of the second connecting portion 27 includes a hinge. Because the second connecting portion 27 is a hinge, the bending portion 26 can be bent more easily and ideally with respect to the display unit 21. As a result, the OLED module 3 supported by the bending portion 26 can also be bent more easily and ideally. Such a feature can reduce more ideally the internal stress generated in each of the layers of the OLED module 3.

OLED Module 3

The OLED module 3 is supported by the casing 2, and includes a plurality of layers including an OLED layer (an OLED panel) 32. The plurality of layers are stacked on top of another through an adhesive.

The plurality of layers may be stacked on top of another through a transparent adhesive such as an optical clear adhesive (OCA). The plurality of layers are stacked on top of another through a transparent adhesive such as an OCA. Such a feature can further reduce the internal stress generated in each of the layers of the OLED module 3.

The adhesive has any given thickness. The thickness is, for example, 15 μm or more and 75 μm or less. The thickness of the adhesive is 15 μm or more and 75 μm or less, and thus is neither excessively thick nor thin. Hence, the OLED module 3 can be fastened to the casing 2, and bent, more ideally.

The OLED module 3 will be described in detail below, with reference to FIG. 1.

In the example illustrated in FIG. 1, the OLED module 3 is supported by, and fastened to, the casing 2 at the display units 211 and 212 and the bending portions 261 and 262.

Furthermore, the OLED module 3 includes a plurality of layers including: a fastening member 31; an OLED layer 32; a touch panel 33; a polarizing film 34; and a window film 35, all of which are stacked on top of another from below. These layers are bonded with a not-shown OCA. The layers of the OLED module 3 may be known ones usually used for the OLED module 3.

Fastening Member 31

The fastening member 31 fastens the OLED module 3 to the casing 2 by bonding or adhesion. Examples of the fastening member 31 include such a bonding member as a double-sided tape.

As illustrated in FIG. 1, the fastening member 31, which is a lowermost layer of the OLED module 3, does not have to be provided to a portion of the support surface S1 of the casing 2. In other words, the support surface S1 of the casing 2 may partially omit the lowermost layer of the OLED module 3, and the support surface S1 may partially act as the unfastened region 29.

For example, as illustrated in FIGS. 1 and 3, the support surface S1 of the casing 2 includes: the unfastened region 291 for bending the OLED module 3; the unfastened region 292; and the unfastened region 293. The unfastened regions 291, 292, and 293 may omit the lowermost layer of the OLED module 3. Thus, the OLED module 3 can be bent without applying excessive force, thereby making it possible to further reduce the internal stress generated in each of the layers in the OLED module 3.

The fastening member 31 has any given thickness. The thickness is, for example, 40 μm or more and 60 μm or less. The thickness of the fastening member 31 is 40 μm or more and 60 μm or less, and thus is neither excessively thick nor thin. Hence, the OLED module 3 can be fastened to the casing 2 more ideally, and the display device 1 including the OLED module 3 can be bent more ideally.

OLED Layer 32

The OLED layer 32 is an organic light-emitting diode including: a light-emitting layer; holes; a cathode; an insulating layer; a conductive layer.

The OLED Layer 32 has any given thickness. The thickness is, for example, 20 μm or more and 40 μm or less. The thickness of the OLED layer 32 is 20 μm or more and 40 μm or less, and thus is neither excessively thick nor thin. Hence, the display device 1 including the OLED module 3 can be bent more ideally.

Touch Panel 33

The touch panel 33 is a panel provided with a touch sensor function.

The touch panel 33 has any given thickness. The thickness is, for example, 5 μm or more and 25 μm or less. The thickness of the touch panel 33 is 5 μm or more and 25 μm or less, and thus is neither excessively thick nor thin. Hence, the display device 1 including the OLED module 3 can be bent more ideally.

Polarizing Film 34

The polarizing film (the polarizing plate) 34 is an optical film used as a polarization supplying element or a polarization detecting element included the display device 1.

The polarizing film 34 has any given thickness. The thickness is, for example, 20 μm or more and 40 μm or less. The thickness of the polarizing film 34 is 20 μm or more and 40 μm or less, and thus is neither excessively thick nor thin. Hence, the display device 1 including the OLED module 3 can be bent more ideally.

Window Film 35

The window film 35 is an outermost layer of the OLED module 3.

The window film 35 has any given thickness. The thickness is, for example, 80 μm or more and 100 μm or less. The thickness of the window film 35 is 80 μm or more and 100 μm or less, and thus is neither excessively thick nor thin. Hence, the display device 1 including the OLED module 3 can be bent more ideally.

Advantageous Effects of Display Device 1

Figure 5:
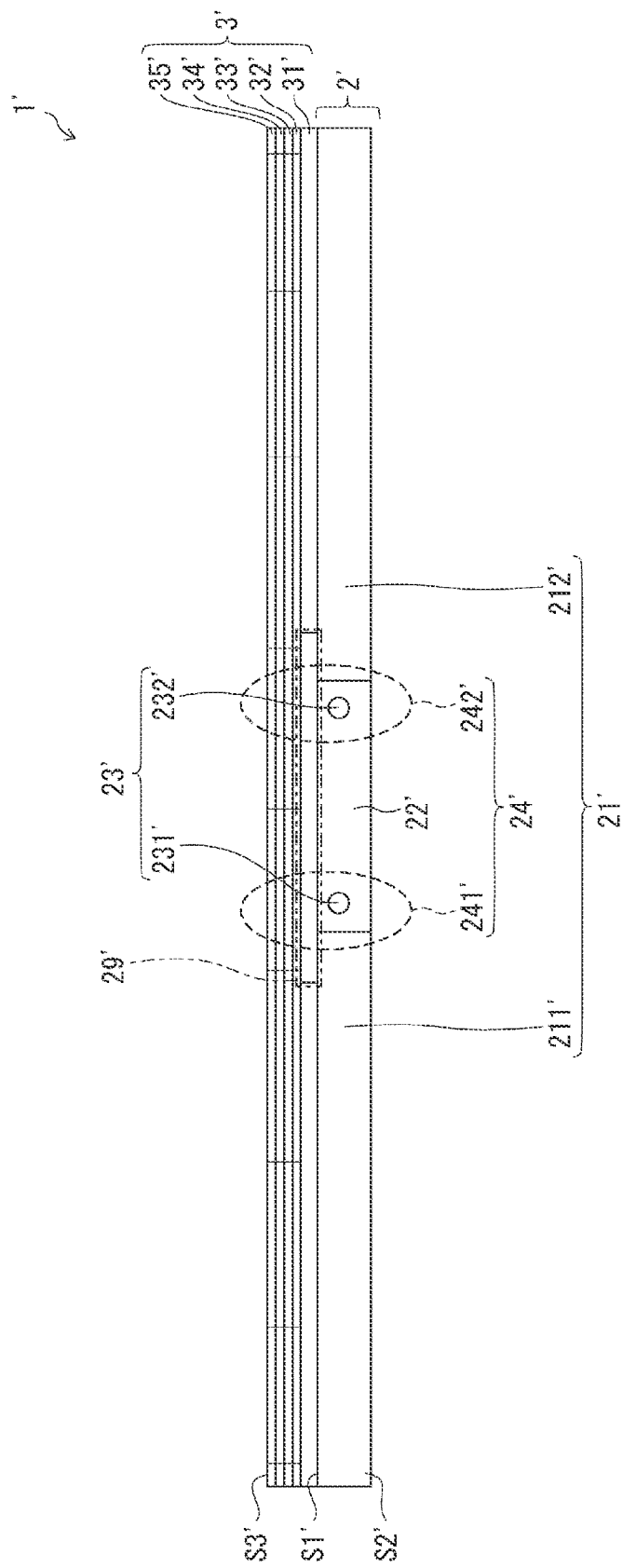
FIG. 5 is a side view illustrating an example of a display device in an open state according to a known technique.
Figure 6:
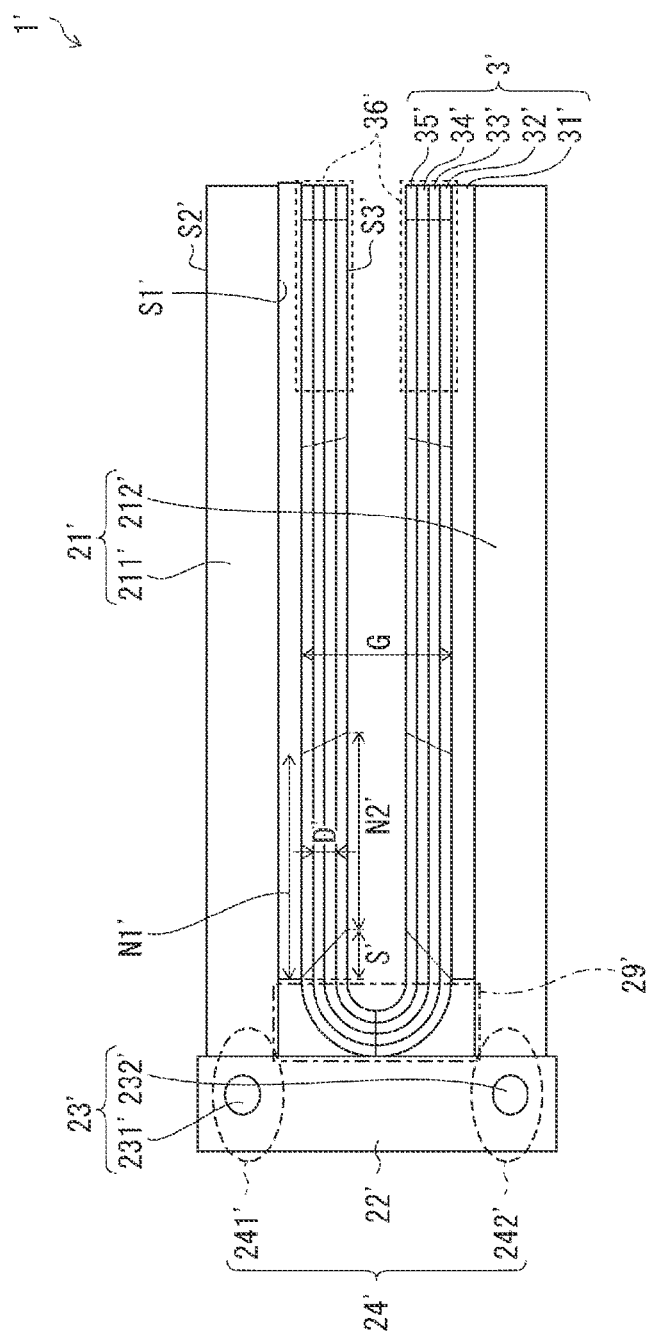
FIG. 6 is a side view illustrating an example of the display device in a closed state according to the known technique.
Figure 7:
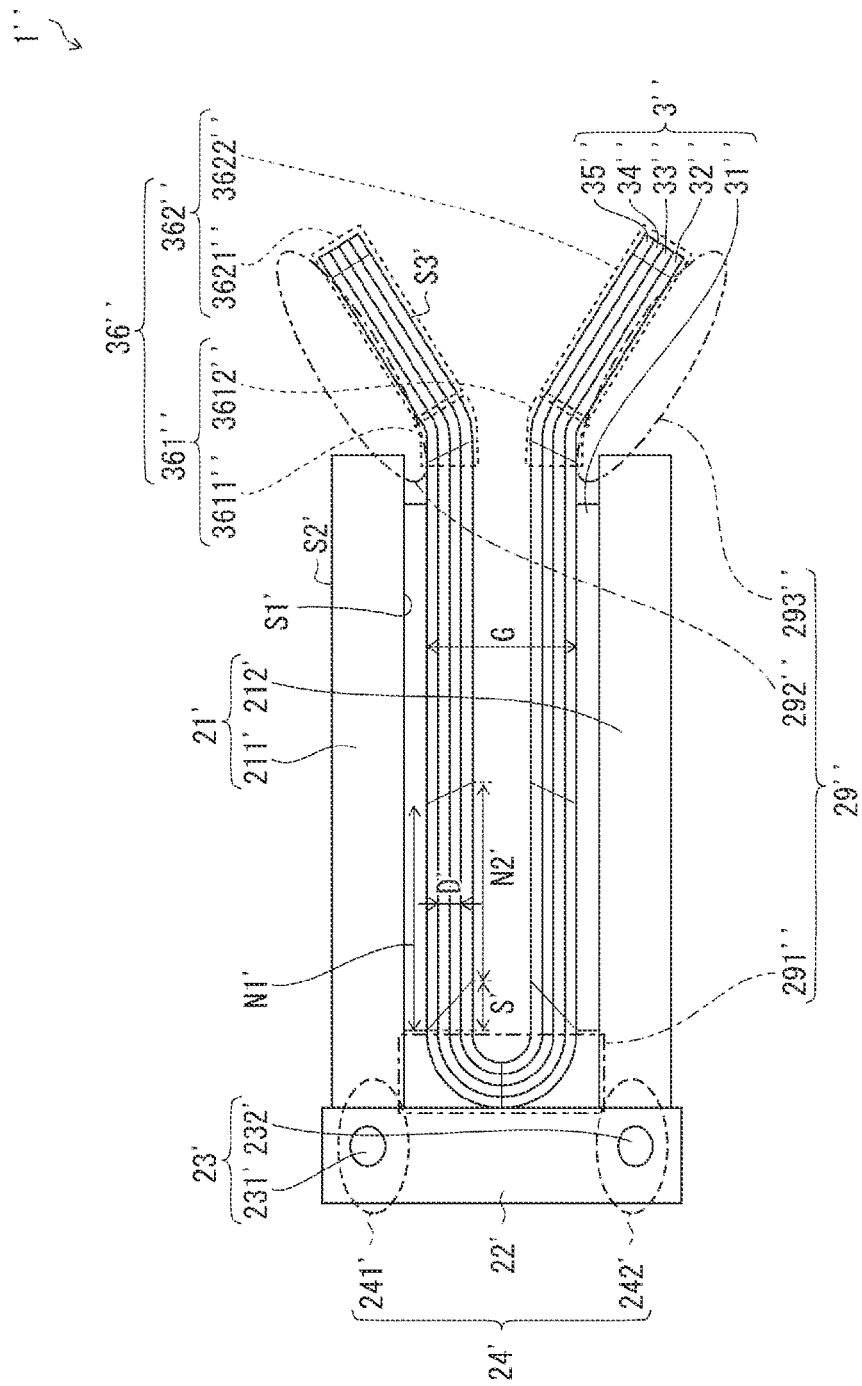
FIG. 7 is a side view illustrating an example of a display device in which an end region of an OLED module is not fastened.

With reference to FIGS. 1 to 7, advantageous effects of the display device 1 according to the first embodiment will be described below in comparison with a display device 1' according to a known technique. FIG. 5 is a side view of the display device 1' in an open state according to a known technique. FIG. 6 is a side view of the display device 1' in a closed state according to the known technique. FIG. 7 is a side view illustrating an example of a display device 1" in which an end region of an OLED module 3" is not fastened.

Display Device 1' according to Prior Art

As illustrated in FIG. 5, the display device 1' includes: a casing 2'; and an OLED module 3' supported by the casing 2'.

The casing 2' includes: a display unit 21'; a support portion 22', and a first connecting portion 23'. The casing 2' includes a bending region 24' and an unfastened region 29'. Of a support surface S1' supporting the OLED module 3' and a coupling surface S2' across from the support surface S1', the support surface S1' is folded together with a display surface S3' of the OLED module 3' into a concave valley shape in the bending region 24'.

The bending region 24' includes a bending region 241' and a bending region 242'. When a display unit 211' rotates upon a first connecting portion 231' and a display unit 212' rotates upon a first connecting portion 232', the bending region 24' is provided for folding the display surface S3' of the casing 2' in a valley shape.

On the other hand, unlike the casing 2 according to the first embodiment, the casing 2' does not include any of the coupling portion 25, the bending portion 26, the second connecting portion 27, or the notch portion 28. Of the unfastened region 29, the casing 2' omits an unfastened region corresponding to the unfastened regions 291 and 292. Otherwise, the casing 2' is the same in configuration as the casing 2 according to the first embodiment.

The OLED module 3' includes: a fastening member 31'; an OLED layer 32'; a touch panel 33'; a polarizing film 34'; and a window film 35', all of which are stacked on top of another from below. These layers are bonded with a not-shown OCA. In the OLED module 3', the fastening member 31' is also provided in a region corresponding to the unfastened regions 291 and 292. Otherwise, the OLED module 3' is the same in configuration as the OLED module 3 according to the first embodiment.

As illustrated in FIG. 6, when the display device 1' is bent, the layers of the OLED module 3' slip, expand, and contract, causing difference in variation between the layers because of the thickness of the OLED module 3'. As a result, each of the layers undergoes internal stresses such as tensile stress and compressive stress. In particular, each of the layers in an end region of the OLED module 3' undergoes delamination stress.

For example, as illustrated in FIG. 6, when the OLED module 3' is folded into a valley shape together with the display device 1', a slip occurs between the layers of the OLED module 3' because the OLED module 3 is bent. An amount of slip between the layers depends not on the radius of each of the layers, but on an interlayer distance.

In the examples illustrated in FIGS. 5 and 6, the OLED module 3' is bent while vertical lines are marked in the same positions of, and arranged horizontally in, the OLED module 3' before bent.

As illustrated in FIG. 6, tensile stress N1' acts on the OLED layer 32', and the OLED layer 32' is pulled. Whereas, compressive stress N2' acts on the window film 35', and the window film 35' is compressed. In this case, a theoretical slip amount L (μm) between these layers is expressed by an equation (1) below, using an interlayer distance D' (μm). For example, a slip amount S' (μm) is 157 (μm), where the interlayer distance D' (μm) is 100 (μm).

$$S'=\pi \cdot D'/2 \qquad (1)$$

Note that, the vertical lines in FIG. 6 clearly show that, in the OLED module 3', the slip amount of each of the layers is controlled because the layers are bonded together with the OCA. For example, a slip amount of an end region of the OLED module 3' is actually smaller than the value of the expression (1) due to the adhesion with the OCA.

When the OLED module 3' is repeatedly bent, plastic deformation is observed of such an adhesive as the OCA bonding together the layers of the OLED module 3', and the adhesive decreases in adhesion strength. As a result, the slip of the OLED module 3' gradually progresses. During the slip, each of the layers of the OLED module 3' continuously undergoes compressive stress or tensile stress, thereby causing variations in dimension of each layer. If the layers attached together have different dimensions, delamination stress occurs.

When the adhesive bonding the layers of the OLED module 3' cannot relief any more the delamination stress generated by the difference in expansion and contraction between the layers, a boundary surface of the adhesive might develop cracks and cause delamination. Furthermore, if the layers are firmly bonded together with the adhesive, the layers of the OLED module 3' might be delaminated from each other, and a crack might open in the panel. As a result, quality appearance of the display device 1' could be spoiled.

Here, FIG. 7 shows a case where an end region 36' of the OLED module 3' in the display device 1' is not fastened to the casing 2'. Note that, for convenience in description, like reference signs designate members having the same functions as those in the above examples. These members will not be elaborated upon repeatedly.

As illustrated in FIG. 7, the display device 1" includes: the casing 2'; and an OLED module 3" supported by the casing 2'.

The OLED module 3" includes: a fastening member 31"; an OLED layer 32"; a touch panel 33"; a polarizing film 34'; and a window film 35", all of which are stacked on top of another from below.

The OLED module 3" has an end region 36" not fastened to the casing 2'. Furthermore, the fastening member 31" is not provided to the end region of the casing 2'. In other words, the layers of the OLED module 3" other than the fastening member 31" are also found in an unfastened region 291" and an unfastened region 292" included in an unfastened region 29". Otherwise, the OLED module 3" is the same in configuration as the OLED module 3" according to known technique.

As illustrated in FIG. 7, in the end region 36" corresponding to the unfastened region 292", a first end region 3611" rises with respect to the display unit 211', and a second end region 3621" warps toward the convexity opposite in direction to the concavity toward which the casing 2' is bent. Likewise, in the end region 36" corresponding to an unfastened region 293", a first end region 3612" rises with respect to the display unit 212', and a second end region 3622" warps toward the convexity opposite in direction to the concavity toward which the casing 2' is bent.

That is, a first end region 361" rises with respect to the display units 211' and 212', and a second end region 362" warps toward the convexity opposite in direction to the convexity toward which the casing 2' is bent.

Thus, the display device 1' according to the related art shows that, when the OLED module 3' is bent, excessive force is applied to the OLED module 3' because of the fastened end region.

Furthermore, if the end region 36" of the OLED module 3" is not fastened but allowed to move freely, the end region 36" warps toward the convexity opposite in direction to the concavity toward which the OLED module 3" is bent, so as to release the stress generated when the OLED module 3" is bent. That is, when the OLED module 3" is bent, if the end region 36" of the OLED module warps toward the convexity opposite in direction to the concavity toward which the OLED module 3" is bent, excessive force is not applied to the OLED module 3".

Display Device 1 According to First Embodiment

On the other hand, as illustrated in the example of FIG. 1, the display device 1 according to the first embodiment includes the OLED module 3 while vertical lines are marked in the same positions of, and arranged horizontally in, the OLED module 3 before bent. When bent, the OLED module 3 looks as seen in FIG. 3.

When the display device 1 is bent in a closing direction toward the concavity, the bending portion 26 is pulled by the coupling portion 25. Accordingly, the end region 36 of the OLED module supported by the bending portion 26 is pulled. In the example illustrated in FIG. 3, the bending portion 26 is bent toward the convexity opposite in direction to the concavity toward which the display device 1 is bent. Accordingly, the end region 36 of the OLED module supported by the bending portion 26 warps toward the convexity.

Thus, the end region 36 can develop an interlayer slip in a direction opposite to an interlayer slip of the OLED module 3 in the unfastened region 291 that is the bending region of the OLED module 3.

For example, tensile stress N1 acting on the OLED layer 32 can be reduced below the tensile stress N1' acting on the OLED layer 32' according to the related art. Likewise, tensile stress N2 acting on the window film 35 can be reduced below the tensile stress N2' acting on the window film 35' according to the related art.

As a result, an amount of expansion of the OLED layer 32' and an amount of contraction of the window film 35 are reduced, so that difference is reduced in dimensional variation between the layers of the OLED module 3. As a result, the internal stress of each of the layers of the OLED module 3 can be canceled out and reduced, which successfully reduces delamination of the layers.

Second Embodiment

In the display device 1 according to the first embodiment, the OLED module 3 is bent in a U-shape. Alternatively, a display device according to the disclosure may be bent in a tear-drop shape as seen in a display device 1X according to a second embodiment.

Described below with reference to FIGS. 8 and 9 will be the display device 1X according to the second embodiment. Note that, for convenience in description, like reference signs designate members having the same functions as those in the above embodiment. These members will not be elaborated upon repeatedly.

Figure 8:
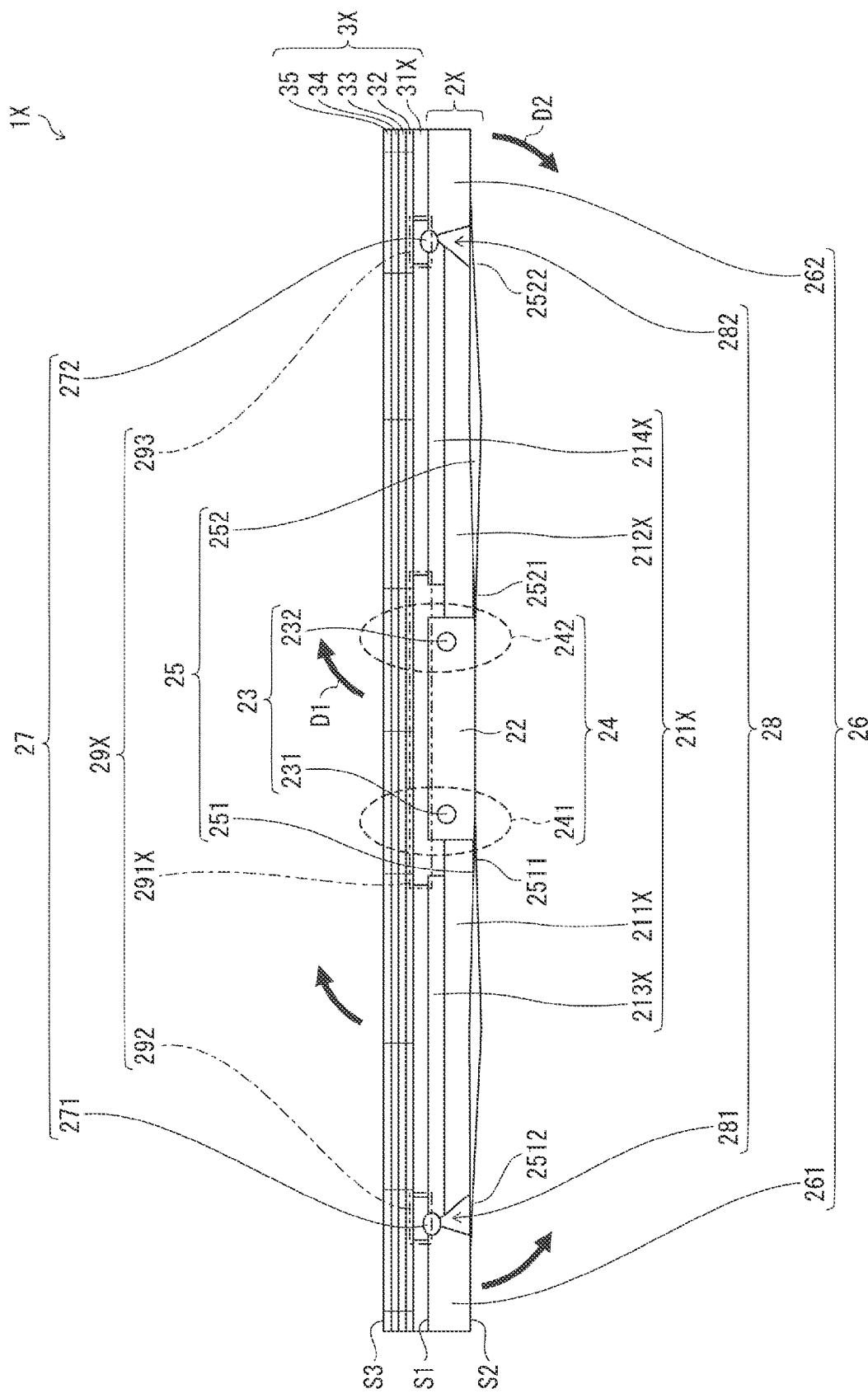
FIG. 8 is a side view illustrating an example of a display device in an open state according to a second embodiment.

FIG. 8 is a side view illustrating an example of the display device 1X in an open state according to the second embodiment. FIG. 9 is a side view illustrating an example of the display device 1X in a closed state according to the second embodiment.

Display Device 1X

As illustrated in FIG. 8, the display device 1X includes: a casing 2X; and an OLED module 3X supported by the casing 2X.

Casing 2X

As illustrated in FIG. 8, the casing 2X includes: a display unit 21X; the support portion 22; the first connecting portion 23; the coupling portion 25; the bending portion 26; and the second connecting portion 27. Furthermore, the casing 2X includes the bending region 24. Moreover, the casing 2X includes: the bending region 24; the notch portion 28; and an unfastened region 29X.

Thus, the casing 2X is the same in configuration as the casing 2 according to the first embodiment, except that the casing 2X includes the display unit 21X instead of the display unit 21 according to the first embodiment.

Display Unit 21X

The display unit 21X includes: a first display unit (a display unit) 211X; a first display unit (a display unit) 212X; a second display unit (a display unit) 213X; and a second display unit (a display unit) 214X.

The first display units 211X and 212X are smaller in height than the display units 211 and 212 according to the first embodiment. Otherwise, the first display units 211X and 212X are the same in configuration as the display units 211 and 212 according to the first embodiment.

The second display units 213X and 214X may have any given configuration as long as the second display units 213X and 214X can ensure visibility of an image displayed on the first display units 211X and 212X. For example, the second display units 213X and 214X may be transparent casings (pseudo casings).

As illustrated in FIG. 8, the second display unit 213X is supported by the first display unit 211X, and provided in a region from a bending portion 261, which is one end region of the casing 2X, toward the bending region 241. The second display unit 214X is supported by the first display unit 212X, and provided in a region from a bending portion 262, which is another end region of the casing 2X, toward the bending region 242.

Hence, the region from the bending portion 261, which is the one end region of the casing 2X, toward the bending region 241, and the region from the bending portion 262, which is the other end region of the casing 2X, toward the bending region 242 are greater in height than any other region of the casing 2X.

Figure 9:
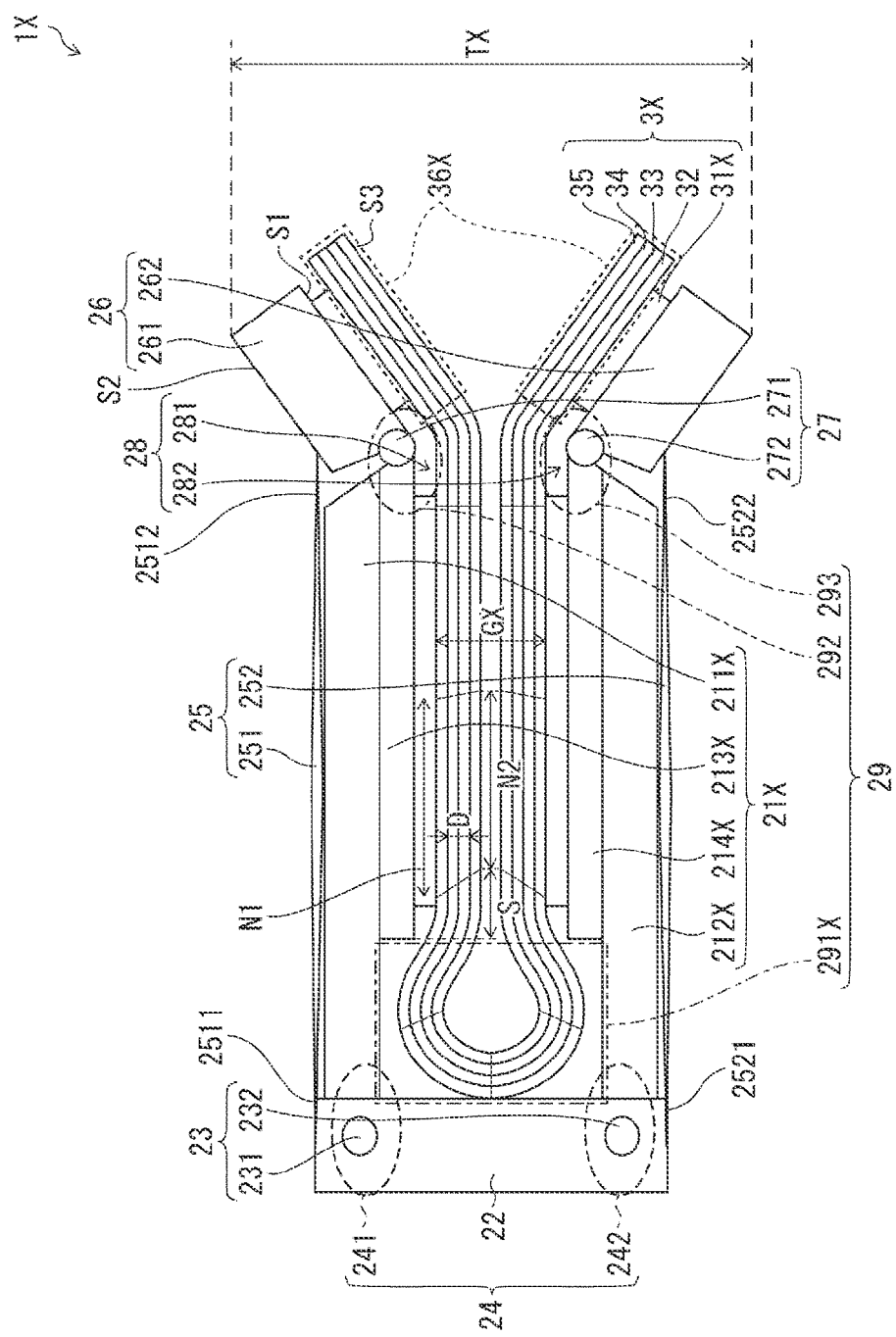
FIG. 9 is a side view illustrating an example of the display device in a closed state according to the second embodiment.

As illustrated in FIG. 9, when the display surface S3 of the OLED module 3X of the display device 1X is folded into a valley shape, the OLED module 3X is shaped into a tear-drop shape bulging in an unfastened region 291X that is a center region for folding the OLED module 3X.

As can be seen, when the OLED module 3X is formed into a tear-drop shape, the OLED module 3X bulges and a slip occurs between the layers. An amount of slip between the layers depends not on the radius of each of the layers, but on an interlayer distance. Furthermore, as to the slip amount between the layers of the OLED module 3X, as seen in the first embodiment, the slip amount between the layers in end region 36X is smaller than the slip amount between the layers in the unfastened region 291X.

Here, when the display device 1X is bent in a closing direction toward the concavity, the bending portion 26 is pulled by the coupling portion 25. Accordingly, the end region 36X of the OLED module supported by the bending portion 26 is pulled. Furthermore, the bending portion 26 is bent toward the convexity opposite in direction to the concavity toward which the display device 1X is bent. Accordingly, the end region 36X of the OLED module supported by the bending portion 26 warps toward the convexity.

Thus, the end region 36X of the OLED module in the display device 1X according to the second embodiment moves in the same manner as the end region 36 of the OLED module in the display device 1 according to the first embodiment. Hence, as seen in the end region 36 of the OLED module in the display device 1 according to the first embodiment, the end region 36X of the OLED module can also develop an interlayer slip in a direction opposite to an interlayer slip of the OLED module 3X in the unfastened region 291X.

Thus, the second embodiment, in which the OLED module 3X is bent in a tear-drop shape, can employ the same technique as the technique disclosed in the first embodiment to bend the OLED module 3 in a U-shape. Hence, the second embodiment can reduce difference in dimensional variation between the layers in the OLED module 3X. As a result, the internal stress of each of the layers in the OLED module 3X can be canceled out and reduced, which successfully reduces delamination of the layers.

Furthermore, a clearance GX (a distance between the fastening members 31X themselves) in the casing 2X of the display device 1X in the closed state is smaller than a clearance G (a distance between the fastening members 31 themselves) in the casing 2 of the display device 1 according to the first embodiment in the closed state.

Moreover, when the OLED module 3X is bent into a tear-drop shape, the bending portion 26 of the casing 2X and the end region 36X of the OLED module 3X are bent toward the convexity at a gentler angle than the bending portion 26 of the casing 2 and the end region 36 of the OLED module 3.

This is because, when the OLED module 3X is bent into a tear-drop shape and the slip amount between the layers and the internal stress are dispersed, the slip amount between the layers and the internal stress do not have to be adjusted only in the end region 36X of the OLED module.

As can be seen, the angle at which the end region 36X of the OLED module warps toward the convexity is gentler than the angle at which the end region 36 of the OLED module warps toward the convexity. Accordingly, a height TX of the display device 1X in the closed state is smaller than a height T of the display device 1 in the closed state. Such features can make the display device 1 entirely thin, and improve the design of the display device 1X.

OLED Module 3X

The OLED module 3X includes a fastening member 31X instead of the fastening member 31 in the first embodiment. Otherwise, the OLED module 3X is the same in configuration as the OLED module 3 according to the first embodiment.

Fastening Member 31X

The fastening member 31X is provided to: the second display units 213X and 214X included in the display unit 21X; and the bending portions 261 and 262. The fastening member 31X is provided to neither the first display unit 211X nor the first display unit 212X. In other words, the fastening member 31X is provided to the casing 2X in an area smaller than an area of the fastening member 31 according to the first embodiment.

Thus, as illustrated in FIG. 9, when the casing 2X of the display device 1X is bent, the OLED module 3X can be ideally bent in a tear-drop shape.

Modification

In the above example, the display unit 21X includes: the first display unit 211X; the first display unit 212X; the second display unit 213X; and the second display unit 214X. However, this embodiment shall not be limited to a case where the display unit 21X includes the first display units and the second display units.

In this embodiment, the region from the bending portion 261, which is the one end region of the casing 2X, toward the bending region 241, and the region from the bending portion 262, which is the other end region of the casing 2X, toward the bending region 242, may be greater in height than any other region of the casing 2X.

Hence, for example, the display unit 21X may include the first display units 211X and 212X alone, and omit the second display units 213X and 214X. The display unit 21X may include a pair of display units alone.

In this case, the region from the second connecting portion 271 of the first display unit 211X toward the bending region 241, and the region from the second connecting portion 272 of the first display unit 212X toward the bending region 242, may be greater in height than any other region of the first display units 211X and 212X.

In other words, the other regions of the first display units 211X and 212X in the casing 2X are provided with notch portions (not shown). As a result, the other regions of the first display units 211X and 212X are smaller in height.

Such features can simplify the display device 1X to include a pair of display units, and form the display device 1X thin to have a quality design. In addition, similar to the above examples, the features can cancel out and reduce the internal stress of each of the layers in the OLED module 3, thereby successfully reducing delamination of the layers.

Third Embodiment

Similar to a display device 1Y according to a third embodiment, the display device according to the disclosure may further include a component and an exterior portion in addition to the members of the display device 1 according to the first embodiment.

Described below with reference to FIGS. 10 to 12 will be the display device 1Y according to the third embodiment. Note that, for convenience in description, like reference signs designate members having the same functions as those in the above embodiments. These members will not be elaborated upon repeatedly.

Figure 10:
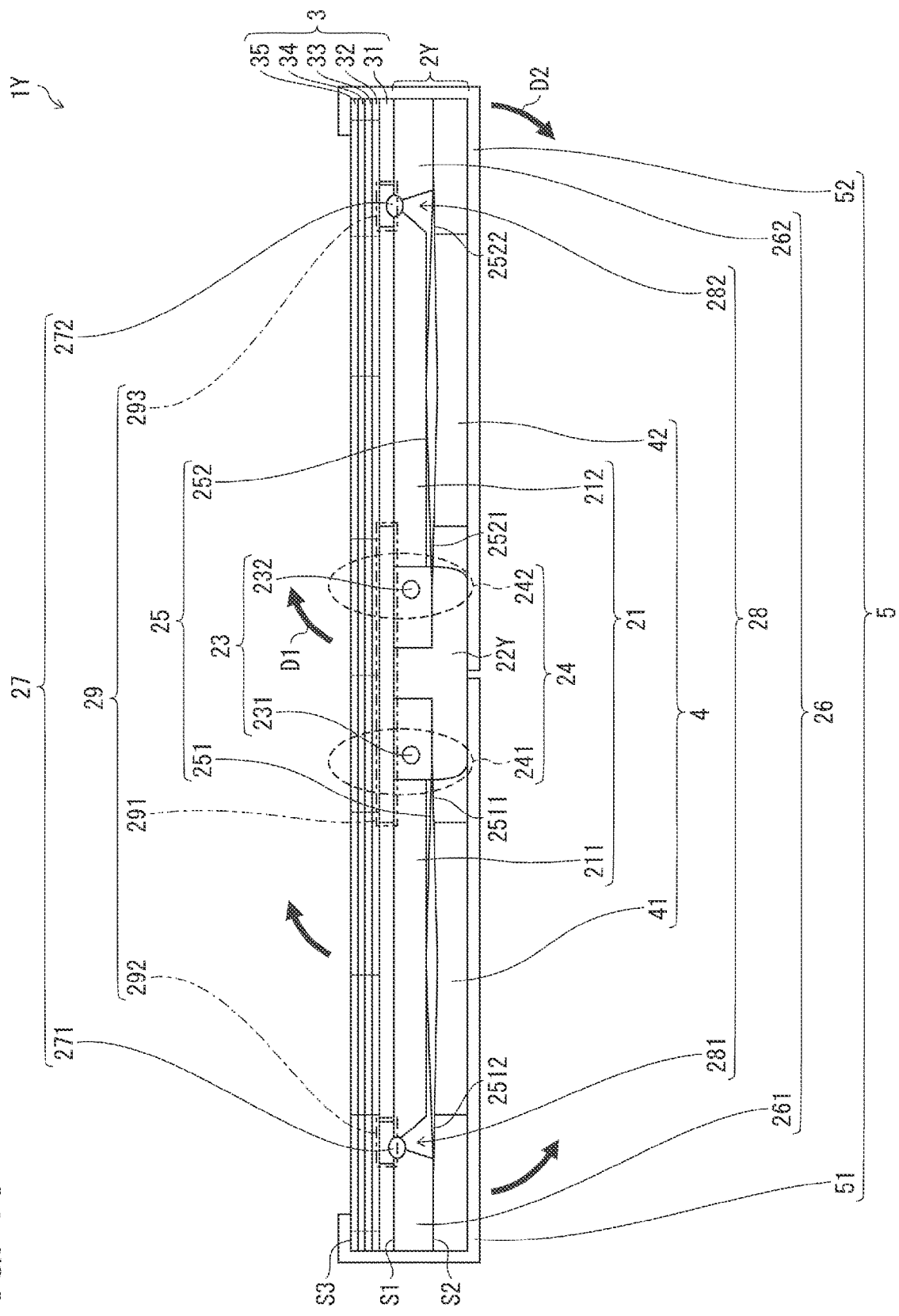
FIG. 10 is a side view illustrating an example of a display device in an open state according to a third embodiment.

FIG. 10 is a side view illustrating an example of the display device 1Y in an open state according to the third embodiment. FIG. 11 is a front view (a front cross-sectional view) illustrating an example of the display device 1Y in the open state according to the third embodiment. FIG. 12 is a top view (a top cross-sectional view) illustrating an example of the display device 1Y in the open state according to the third embodiment. FIG. 13 is a side view illustrating an example of the display device 1Y in a closed state according to the third embodiment.

Display Device 1Y

As illustrated in FIG. 10, the display device 1Y includes the members of the display device 1 according to the first embodiment, and further includes: a component 4; and an exterior portion 5. The display device 1Y includes a casing 2Y instead of the casing 2 according to the first embodiment. Otherwise, the display device 1Y is the same in configuration as the display device 1 according to the first embodiment.

Casing 2Y

As illustrated in FIG. 10, the casing 2Y includes a support portion 22Y instead of the support portion 22 according to the first embodiment. Otherwise, the casing 2Y is the same in configuration as the casing 2 according to the first embodiment.

Support Portion 22Y

The support portion 22Y is thicker than the support portion 22 in the first embodiment. For example, the support portion 22Y has a thickness to such an extent that a bottom surface of the support portion 22Y is smaller than, or equal to, a bottom surface of the component 4.

Thanks to such a feature, the component 4, the casing 2Y, and the OLED module 3 can be ideally wrapped with the exterior portion 5 from outside.

Component 4

The component 4 is provided in at least a portion of a region included in the coupling surface S2 of the casing 2Y, other than the bending portion 26 that is at least one end region of the casing 2.

In the examples illustrated in FIGS. 10 to 13, a component 41 and a component 42 are respectively provided to the bending portion 261 that is one end region of the casing 2Y and the bending portion 262 that is an other end region of the casing 2Y. The bending portions 261 and 262 are included in the coupling surface S2 of the casing 2Y. In other words, the component 4 is not provided on the coupling surface S2 of the bending portion 26 (below the bending portion 26). Hence, between the bending portion 26 and the exterior portion 5, a space is secured (open) for the bending portion 26 to bend.

Thus, the display device 1Y further includes the component 4. FIG. 13 shows that, similar to the display device 1 according to the first embodiment, when the display device 1Y is closed and the bending portions 261 and 262 are bent toward the convexity, the bending portions 261 and 262 do not interfere with the components 41 and 42.

The component 4 is any given component. Examples of the component 4 include such known components as a battery and a substrate.

Exterior Portion 5

The exterior portion 5 covers the members of the display device 1Y from outside.

Figure 11:
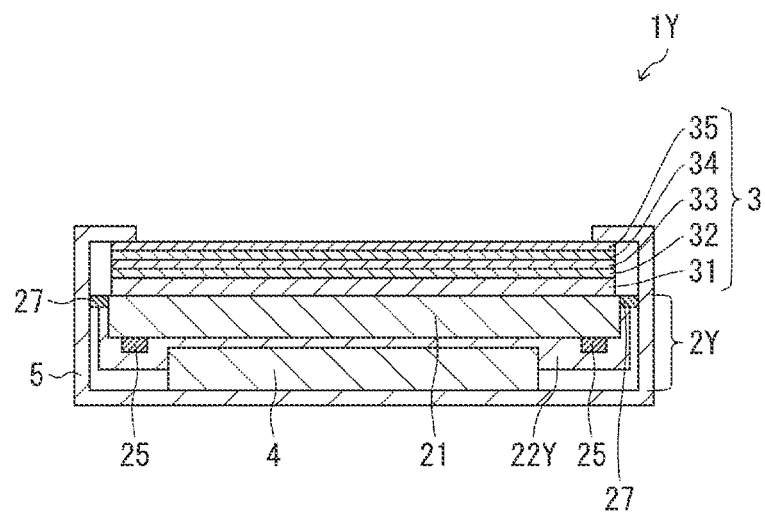
FIG. 11 is a front view illustrating an example of the display device in the open state according to the third embodiment.
Figure 12:
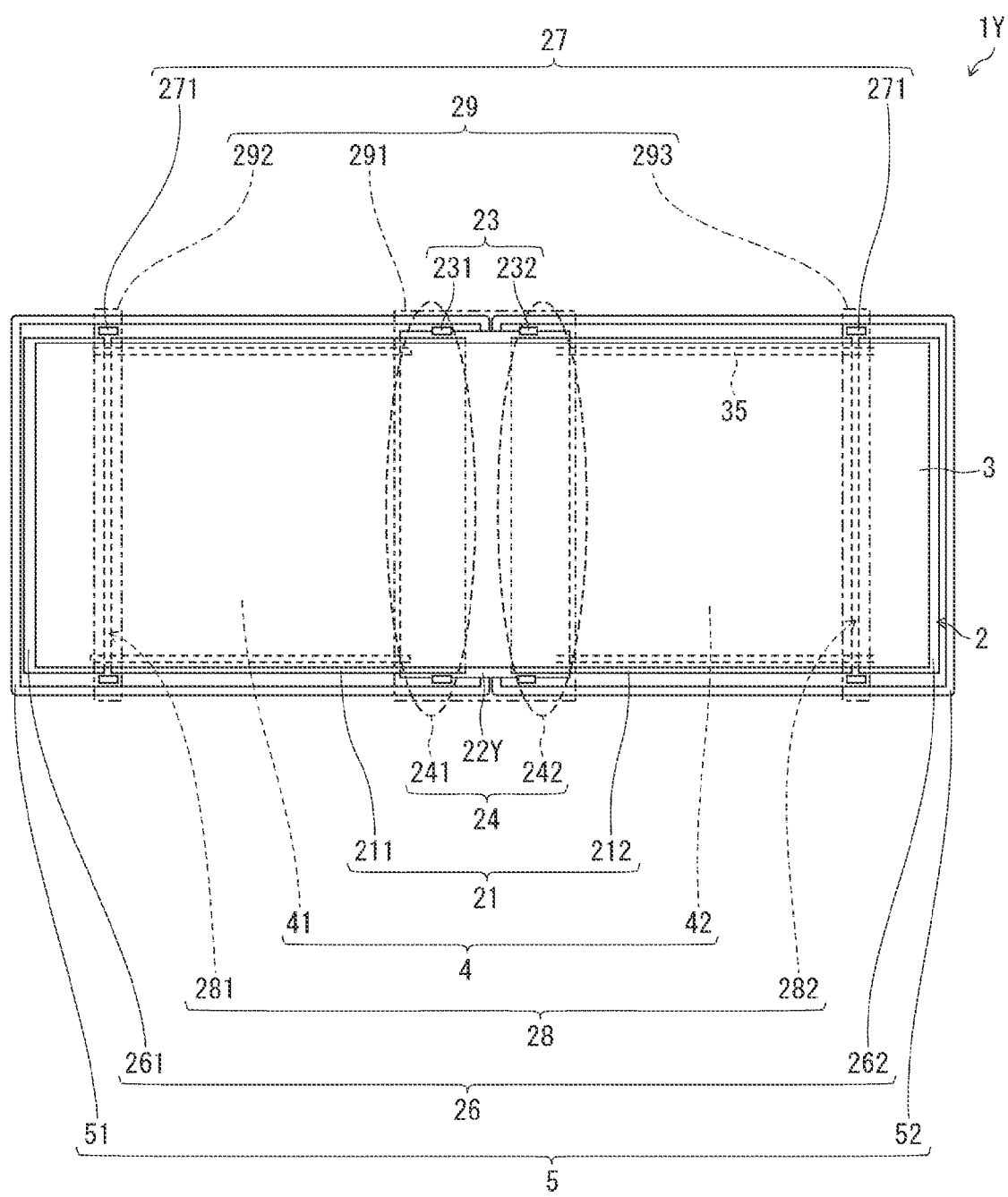
FIG. 12 is a top view illustrating an example of the display device in the open state according to the third embodiment.
Figure 13:
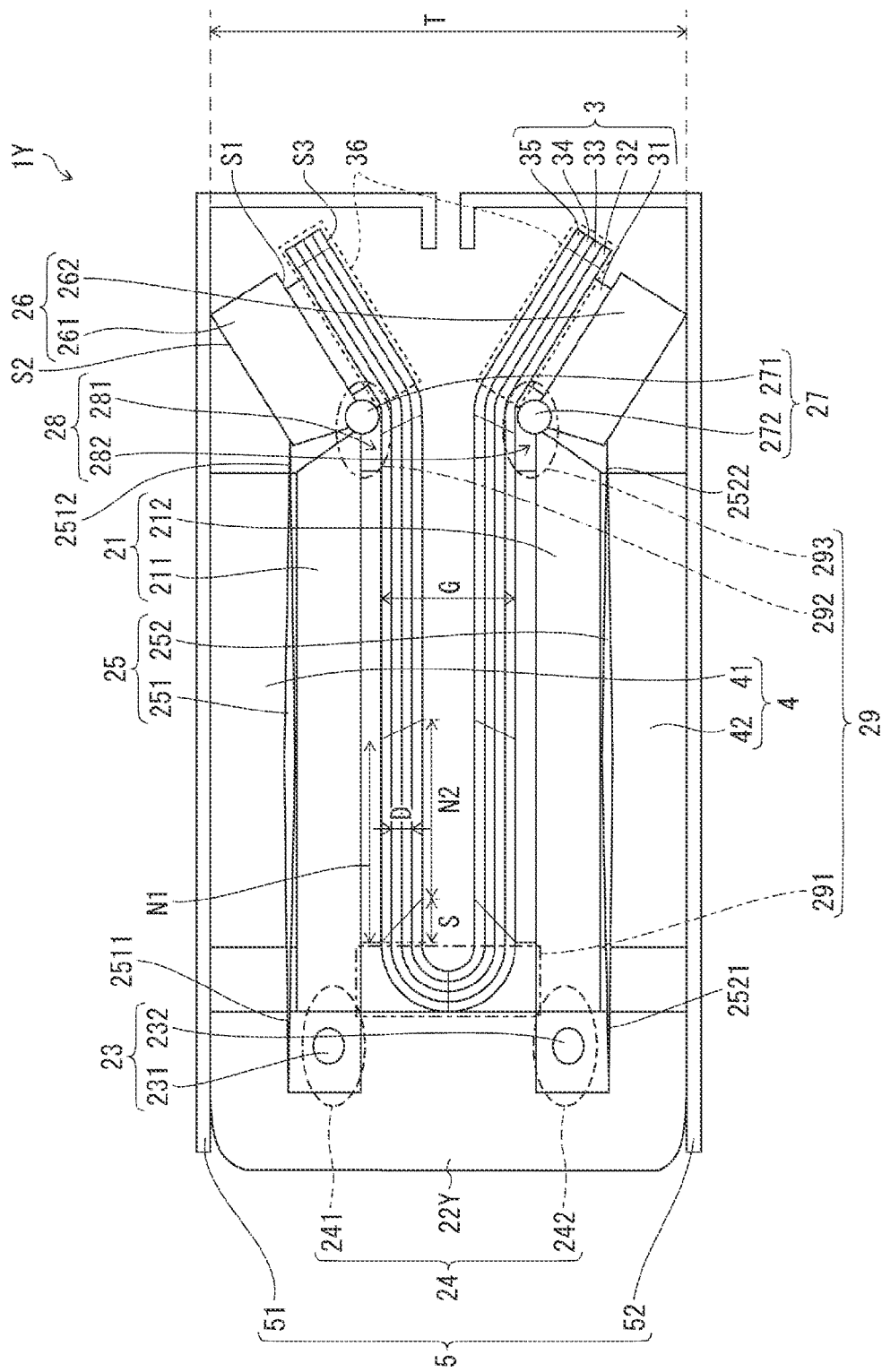
FIG. 13 is a side view illustrating an example of the display device in a closed state according to the third embodiment.

Specifically, as illustrated in FIGS. 10 to 12, when the display device 1Y is open flat, the exterior portion 5 covers and fastens: a portion of the display surface S3 of the OLED module 3; side surfaces of the OLED module 3 and the casing 2Y; the support portion 22Y of the casing 2Y; and the component 4.

Specifically, when the display device 1Y is open flat, an exterior portion 51 covers and fastens: a portion of the display surface S3 of the OLED module 3; a side surface of the bending portion 261 including the OLED module 3 and the casing 2Y; a portion of the support portion 22 of the casing 2Y; and the component 41. Likewise, an exterior portion 52 covers and fastens: a portion of the display surface S3 of the OLED module 3; a side surface of the bending portion 262 including the OLED module 3 and the casing 2Y; a portion of the support portion 22 of the casing 2Y; and the component 42.

Furthermore, as illustrated in FIG. 13, when the display surface S3 of the OLED module 3 is folded into a valley shape and the display device 1Y is folded, the exterior portion 5 wraps the casing 2Y, the OLED module 3 and the component 4 from outside.

Specifically, when the display device 1Y is folded, the exterior portion 51 wraps from outside a portion of the support portion 22Y of the casing 2Y, a portion of the OLED module 3, and the component 41. Likewise, the exterior portion 52 wraps from outside a portion of the support portion 22Y of the casing 2Y, a portion of the OLED module 3, and the component 42.

As can be seen, the exterior portion 5 wraps the members of the display device 1Y from outside. Similar to the display device 1 according to the first embodiment, such a feature can cancel out and reduce the internal stress of each of the layers in the OLED module 3, thereby successfully reducing delamination of the layers and ideally protecting the display device 1Y.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined together to achieve a new technical feature.

SUMMARY

A display device according to a first aspect of the disclosure includes: a casing; and an OLED module supported by the casing and including a plurality of layers including an OLED layer, the plurality of layers being stacked on top of another through an adhesive. The casing includes a coupling portion coupling together, on a coupling surface provided across from a support surface supporting the OLED module, a bending region of the casing and at least one end region of the casing. The coupling portion includes coupling portions. The coupling surface and the support surface are included in a surface of the casing. The bending region includes bending regions for folding a display surface of the OLED module into a valley shape. When the display surface is folded into a valley shape in a first direction, the coupling portion pulls the at least one end region of the casing in a second direction for folding the display surface into a mountain shape. The second direction is opposite to the first direction.

As to the display device, of a second aspect of the disclosure according to the first aspect, when the display surface is folded into a valley shape, the at least one end region of the casing may be bent in the second direction.

As to the display device, of a third aspect of the disclosure, according to the second aspect, the support surface may include a bending region of the OLED module for bending the OLED module, the bending region omitting a lowermost surface of the OLED module.

As to the display device, of a fourth aspect of the disclosure, according to the second or third aspect, the casing may include: a display unit including display units; a support portion supporting the display unit; a bending portion including bending portions serving as the at least one end region of the casing; a first connecting portion rotatably connecting together one end region of the display unit and one end region of the support portion; and a second connecting portion rotatably connecting together an other end region of the display unit and one end region of the bending portion. When the display unit rotates upon the first connecting portion so that the display surface is folded into a valley shape, the bending portion may rotate in the second direction upon the second connecting portion.

As to the display device, of a fifth aspect of the disclosure, according to the fourth aspect, the coupling portion may be provided below the first connecting portion and the second connecting portion.

As to the display device, of a sixth aspect of the disclosure, according to the fourth or fifth aspect, the second connecting portion may be provided to the support surface including: the other end region of the display unit; and the one end region of the bending portion. The coupling surface may include a region across from the second connecting portion. The region may include a notch portion.

As to the display device, of a seventh aspect of the disclosure, according to any one of the fourth to sixth aspects, at least one of the first connecting portion or the second connecting portion may be a hinge.

As to the display device, of an eighth aspect of the disclosure, according to any one of the first to seventh aspects, the coupling portion may have at least one end region inclined inwards and tapered.

As to the display device, of a nineth aspect of the disclosure, according to any one of the first to eighth aspects, the coupling portion may be either a SUS plate or a shaft.

As to the display device, of a tenth aspect of the disclosure, according to any one of the first to ninth aspects, the plurality of layers may be stacked on top of another through a transparent adhesive.

As to the display device, of an eleventh aspect of the disclosure, according to any one of the first to tenth aspects, a region from the one end region of the casing toward the bending region of the casing, and a region from an other end region of the casing toward the bending region of the casing may be greater in height than any other region of the casing.

The display device, of a twelfth aspect of the disclosure, according to any one of the first to eleventh aspects may further include: a component provided in at least a portion of a region included in the coupling surface, other than the at least one end region of the casing; and an exterior portion wrapping the casing, the OLED module, and the component from outside, when the display surface is folded into a valley shape.

The invention claimed is:

1. A display device, comprising:
a casing; and
an OLED module supported by the casing and including a plurality of layers including an OLED layer, the plurality of layers being stacked on top of another through an adhesive,
wherein the casing includes a coupling portion coupling together, on a coupling surface provided across from a support surface supporting the OLED module, a bending region of the casing and at least one end region of the casing, the coupling portion including one or more coupling portions, the coupling surface and the support surface being included in a surface of the casing, and the bending region including one or more bending regions for folding a display surface of the OLED module into a valley shape, and
when the display surface is folded into a valley shape in a first direction, the coupling portion pulls the at least one end region of the casing in a second direction for folding the display surface into a mountain shape, the second direction being opposite to the first direction.

2. The display device according to claim 1,
wherein when the display surface is folded into a valley shape, the at least one end region of the casing is bent in the second direction.

3. The display device according to claim 2,
wherein the support surface includes a bending region of the OLED module for bending the OLED module, the bending region omitting a lowermost surface of the OLED module.

4. The display device according to claim 2,
wherein the casing includes:
a display unit including display units;
a support portion supporting the display unit;
a bending portion including bending portions serving as the at least one end region of the casing;
a first connecting portion rotatably connecting together one end region of the display unit and one end region of the support portion; and
a second connecting portion rotatably connecting together an other end region of the display unit and one end region of the bending portion, and
when the display unit rotates upon the first connecting portion so that the display surface is folded into a valley shape, the bending portion rotates in the second direction upon the second connecting portion.

5. The display device according to claim 4,
wherein the coupling portion is provided below the first connecting portion and the second connecting portion.

6. The display device according to claim 4,
wherein the second connecting portion is provided to the support surface including: the other end region of the display unit; and the one end region of the bending portion, and
the coupling surface includes a region across from the second connecting portion, the region including a notch portion.

7. The display device according to claim 4,
wherein at least one of the first connecting portion or the second connecting portion is a hinge.

8. The display device according to claim 1,
wherein the coupling portion has at least one end region inclined inwards and tapered.

9. The display device according to claim 1,
wherein the coupling portion is either a SUS plate or a shaft.

10. The display device according to claim 1,
wherein the plurality of layers are stacked on top of another through a transparent adhesive.

11. The display device according to claim 1,
wherein a region from the one end region of the casing toward the bending region of the casing, and a region from an other end region of the casing toward the bending region of the casing are greater in height than any other region of the casing.

12. The display device according to claim 1, further comprising:
a component provided in at least a portion of a region included in the coupling surface, other than the at least one end region of the casing; and an exterior portion wrapping the casing, the OLED module, and the component from outside, when the display surface is folded into a valley shape.

\* \* \* \* \*